US011130883B2

(12) United States Patent
Tsuchiya et al.

(10) Patent No.: US 11,130,883 B2
(45) Date of Patent: Sep. 28, 2021

(54) POLISHING COMPOSITION

(71) Applicant: FUJIMI INCORPORATED, Kiyosu (JP)

(72) Inventors: Kohsuke Tsuchiya, Kiyosu (JP); Maki Asada, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 16/462,729

(22) PCT Filed: Nov. 15, 2017

(86) PCT No.: PCT/JP2017/041025
§ 371 (c)(1),
(2) Date: May 21, 2019

(87) PCT Pub. No.: WO2018/096991
PCT Pub. Date: May 31, 2018

(65) Prior Publication Data
US 2019/0359856 A1 Nov. 28, 2019

(30) Foreign Application Priority Data
Nov. 22, 2016 (JP) .............................. JP2016-226666

(51) Int. Cl.
*C09G 1/02* (2006.01)
*C08K 3/36* (2006.01)
*C08L 1/08* (2006.01)
*C08L 29/04* (2006.01)
*H01L 21/304* (2006.01)
*C09K 3/14* (2006.01)
*B24B 37/00* (2012.01)
*H01L 21/321* (2006.01)

(52) U.S. Cl.
CPC .................. *C09G 1/02* (2013.01); *C08K 3/36* (2013.01); *C08L 1/08* (2013.01); *C08L 29/04* (2013.01); *H01L 21/304* (2013.01)

(58) Field of Classification Search
None
See application file for complete search history.

(56) References Cited

U.S. PATENT DOCUMENTS

| 5,578,362 | A | 11/1996 | Reinhardt | |
|---|---|---|---|---|
| 2005/0054203 | A1* | 3/2005 | Yamada | C09G 1/02 438/695 |
| 2010/0003821 | A1 | 1/2010 | Morinaga | |
| 2015/0210892 | A1* | 7/2015 | Tsuchiya | C09K 3/1436 526/264 |
| 2015/0376464 | A1 | 12/2015 | Tsuchiya | |
| 2016/0020395 | A1 | 1/2016 | Funyuu et al. | |

FOREIGN PATENT DOCUMENTS

| CN | 1082567 A | 2/1994 |
|---|---|---|
| CN | 1613941 A | 5/2005 |
| CN | 104995277 A | 10/2015 |
| EP | 2236574 A1 | 10/2010 |
| JP | 2005085858 A | 3/2005 |
| JP | 2012089862 A | 5/2012 |
| JP | 2014-151424 A | 8/2014 |
| JP | 2015124231 A | 7/2015 |
| TW | 200517481 A | 6/2005 |
| TW | 201639941 A | 11/2016 |
| WO | WO-2014/034425 A1 | 3/2014 |
| WO | WO2014126051 A1 | 8/2015 |

OTHER PUBLICATIONS

Extended European Search Report issued in corresponding European Application No. 17873850.3 dated Jun. 24, 2020.
Office Action issued in corresponding Chinese Application No. 201780072039.6 dated Jul. 20, 2020 with English translation.
Office Action issued in corresponding Chinese Patent Application No. 201780072039.6 dated Jan. 20, 2021 with English translation.
Office Action issued in corresponding Taiwanese Patent Application No. 106140234 dated May 11, 2021.

* cited by examiner

*Primary Examiner* — Stephanie P Duclair
(74) *Attorney, Agent, or Firm* — Foley & Lardner LLP

(57) ABSTRACT

Provided is a polishing composition that includes a cellulose derivative and is effective for reducing surface defects after polishing. According to the present application, a polishing composition comprising an abrasive, a basic compound and a surface protective agent is provided. The surface protective agent contains a cellulose derivative and a vinyl alcohol-based dispersant. The surface protective agent has a dispersibility parameter α of less than 100.

19 Claims, No Drawings

POLISHING COMPOSITION

TECHNICAL FIELD

The present invention relates to a polishing composition. The present application claims priority based on Japanese Patent Application No. 2016-226666 filed on Nov. 22, 2016, the entire contents of which application are incorporated herein by reference.

BACKGROUND ART

Polishing using a polishing composition including an abrasive is performed on the surface of a material such as a metal, a metalloid, a nonmetal, an oxide thereof, or the like. For example, the surface of a silicon substrate used for manufacturing a semiconductor product or the like is generally finished into a high-quality mirror surface through a lapping step and a polishing step. The polishing step typically includes a stock polishing step and a final polishing step. Patent Literature 1 and 2 are cited as technical literature on polishing compositions mainly used for polishing semiconductor substrates such as silicon wafers.

CITATION LIST

Patent Literature

Patent Literature 1: Japanese Patent Application Publication No. 2012-89862
Patent Literature 2: Japanese Patent Application Publication No. 2015-124231

SUMMARY OF INVENTION

Technical Problem

The polishing composition used in the final polishing step is required to be capable of realizing a surface with low haze and few surface defects after polishing. The final polishing step may be, for example, a final polishing step of a semiconductor substrate such as a silicon wafer or, other substrate. In addition to abrasive and water, polishing compositions for such applications often include water-soluble polymers for the purpose of protecting the surface of the polishing object, improving wettability and the like. Among them, a general-purpose water-soluble polymer is exemplified by hydroxyethyl cellulose (HEC).

Cellulose derivatives typically including HEC are derived from cellulose, which is a natural product, and thus have varied quality. Therefore, it was difficult to accurately prevent micro aggregation that may cause surface defects in conventional polishing compositions including cellulose derivatives. Patent Literature 1 and 2 disclose techniques for reducing surface defects in polishing compositions including HEC. However, even the techniques could not always sufficiently address the level of the surface quality after polishing that is required in recent years.

In view of the circumstances, it is an object of the present invention to provide a polishing composition that includes a cellulose derivative and is effective for reducing surface defects after polishing.

Solution to Problem

The polishing composition provided by the present specification includes an abrasive, a basic compound and a surface protective agent. The surface protective agent includes a cellulose derivative and a vinyl alcohol-based dispersant. The surface protective agent has a dispersibility parameter $\alpha$ of less than 100. With such a polishing composition, surface defects after polishing may be effectively reduced while exploiting an advantage of use of the cellulose derivatives. The polishing composition is effective, for example, for reducing defects referred to as LPD-N (Light Point Defect Non-cleanable) that cannot be eliminated by processing such as polishing, cleaning and drying.

The cellulose derivative may have a weight average molecular weight (Mw) of, for example, $5 \times 10^4$ or more and less than $50 \times 10^4$. With the cellulose derivative having a Mw in the above range, functions such as protection of polishing objects and wettability improvement tend to be suitably exhibited while decreasing the dispersibility parameter $\alpha$.

The Mw of the vinyl alcohol-based dispersant may be, for example, 90% or less of the Mw of the cellulose derivative. According to the configuration, an effect of reducing the dispersibility parameter $\alpha$ by use of the vinyl alcohol-based dispersant tends to be more effectively exhibited.

The content of the vinyl alcohol-based dispersant may be, for example, 0.1 g or more and 80 g or less with respect to 100 g of the cellulose derivative. By such a composition, an effect due to the combined use of the cellulose derivative and the vinyl alcohol-based dispersant may be suitably exhibited.

The total content, of the cellulose derivative and the vinyl alcohol-based dispersant may be, for example, 1.5 g or more and 20 g or less with respect to 100 g of the abrasive. With such as a polishing composition, generation of another defect on a polishing object due to pressure associated with polishing may be prevented and the finally obtained polished object may have a high quality surface.

The surface protective agent may further contain an oxyalkylene-based additive. By such a composition, an effect due to the combined use of the cellulose derivative and the vinyl alcohol-based dispersant may be suitably exhibited and a higher quality surface may be achieved.

In one embodiment of the polishing composition disclosed herein, the oxyalkylene-based additive may include an oxyalkylene-based additive $OA_L$ having a Mw of less than 5000. By use of the oxyalkylene-based additive $OA_L$, surface defects after polishing may be further reduced.

The abrasive used in the art disclosed herein may preferably be silica particles. The present invention may be preferably implemented in the form of the polishing composition including silica particles as the abrasive.

The polishing composition disclosed herein may be used for polishing of various polishing objects. Among others, the polishing composition may be preferably used for polishing silicon wafers and other substrates. The polishing composition is particularly suitable for final polishing of silicon wafers.

DESCRIPTION OF EMBODIMENTS

Preferred embodiments of the present invention will be described below. Incidentally, matters other than matters particularly mentioned in the present specification and necessary for the implementation of the present invention can be grasped as design matters of those skilled in the art based on the prior art in the relevant field. The present invention can be carried out based on the contents disclosed in this specification and technical common sense in the field.

<Abrasive>

The material and properties of the abrasive included in the polishing composition disclosed herein are not particularly limited and can be appropriately selected according to the purpose of use and application of the polishing composition. Examples of abrasive include inorganic particles, organic particles, and organic-inorganic composite particles. Specific examples of the inorganic particles include oxide particles such as silica particles, alumina particles, cerium oxide particles, chromium oxide particles, titanium dioxide particles, zirconium oxide particles, magnesium oxide particles, manganese dioxide particles, zinc oxide particles, red iron oxide particles and the like; nitride particles such as silicon nitride particles, boron nitride particles and the like; carbide particles such as silicon carbide particles, boron carbide particles and the like; diamond particles; and carbonates such as calcium carbonate, barium carbonate and the like. Specific examples of the organic particles include polymethyl methacrylate (PMMA) particles, poly(meth)acrylic acid particles, polyacrylonitrile particles and the like. Such abrasive may be used singly or in combination of two or more types thereof. In the present specification, (meth)acrylic means to be inclusive of acrylic and methacrylic. Likewise, (meth)acryloyl as used herein means to be inclusive of acryloyl and methacryloyl.

As the above abrasive, inorganic particles are preferable, and among them, particles composed of oxides of metals or metalloid are preferable, and silica particles are particularly preferable. In polishing compositions that can be used for polishing, for example, for final polishing, of polishing objects having a surface made of silicon, such as silicon wafers described below, it is particularly significant to use silica particles as abrasive. The disclosed herein can be preferably implemented, for example, in an embodiment in which the abrasive is substantially composed of silica particles. Here, "substantially" means that 95% by weight or more, preferably 98% by weight or more, more preferably 99% by weight or more of the particles constituting the abrasive is silica particles, and it includes that 100% by weight of the particles are silica particles.

Specific examples of silica particles include colloidal silica, fumed silica, precipitated silica, and the like. The silica particles may be used singly or in combination of two or more types thereof. The use of colloidal silica is particularly preferable, since a polished surface excellent in surface quality can be easily obtained after polishing. For example, colloidal silica prepared by ion exchange method using water glass (sodium silicate) as a raw material and alkoxide method colloidal silica can be preferably used. Alkoxide method colloidal silica refers to colloidal silica produced by a hydrolytic condensation reaction of an alkoxysilane. Colloidal silica may be used singly combination of two or more types thereof.

The true specific gravity (true density) of the abrasive constituting material is preferably 1.5 or more, more preferably 1.6 or more and still more preferably 1.7 or more. The true specific gravity of the abrasive constituting material as used herein means, for the abrasive formed with for example silica particles, the true specific gravity of silica that forms the silica particles. The true specific gravity of the abrasive constituting material hereinafter may also be referred to as the true specific gravity of the abrasive. As the true specific gravity of the abrasive increases, the physical polishing ability of the abrasive tends to increase. The upper limit of the true specific gravity of the abrasive is not particularly limited and is typically 2.3 or less such as 2.2 or less. The true specific gravity of the abrasive may be a value measured by a liquid displacement method using ethanol as a displacement liquid. The abrasive may be, for example, silica particles.

The BET diameter of the abrasive is not particularly limited, but from the viewpoint of polishing removal rate and the like, the BET diameter is preferably 5 nm or more and more preferably 10 nm or more. From the viewpoint of obtaining a higher polishing effect, for example, from the viewpoint of better exhibiting the effect of reducing haze, removing defects and the like, the BET diameter is preferably, for example, 15 nm or more, more preferably 20 nm or more, and still more preferably more than 20 nm. Also, from the viewpoint of suppressing the local stress created by the abrasive in the surface of the polishing object, the BET diameter of the abrasive is preferably 100 nm or less, more preferably 50 nm or less, and even more preferably 40 nm or less. From the viewpoint of making it easier to obtain a higher quality surface, for example, a surface having a small number of LPD-N and a low haze level, the art disclosed herein may be implemented in an embodiment of using abrasive having a BET diameter of 35 nm or less, preferably less than 35 nm, more preferably 32 nm or less, for example, less than 30 nm. The abrasive can be, for example, silica particles.

In the present specification, the BET diameter refers to the particle diameter calculated by a formula of BET diameter $[nm]=6000/($ true density $[g/cm^3] \times$ BET value $[m^2/g])$ from the specific surface area (BET value) measured by the BET method. For example, in the case of silica particles, the BET diameter can be calculated from BET diameter $[nm]=2727/$ BET value $[m^2/g]$. The specific surface area can be measured, for example, by using a surface area measuring apparatus "Flow Sorb II 2300" manufactured by Micromeritics Instrument Corporation.

The shape (outer shape) of the abrasive may be globular or non-globular. Specific examples of non-globular particles include particles of a peanut shape, a cocoon shape, a konpeito shape, a rugby ball shape and the like. The above-mentioned peanut shape is the shape of the peanut shell. For example, abrasive in which most of the particles have a peanut shape or a cocoon shape can preferably be used.

Although not particularly limited, the average aspect ratio of the abrasive, that is, the average value of the major axis/minor axis ratio of the abrasive is in principle 1.0 or more, preferably 1.05 or more, and even more preferably 1.1 or more. By increasing the average aspect ratio, it is possible to achieve higher polishing removal rate. From the viewpoint of reducing scratching and the like, the average aspect ratio of the abrasive is preferably 3.0 or less, more preferably 2.0 or less, and even more preferably 1.5 or less.

The shape (outer shape) and the average aspect ratio of the abrasive can be grasped by, for example, observation with an electron microscope. A specific procedure for grasping the average aspect ratio includes, for example, drawing a minimum rectangle circumscribing each particle image for predetermined number of silica particles for which the shape of an independent particle can be recognized by using a scanning electron microscope (SEM). The predetermined number is, for example, 200 particles. Then, with respect to the rectangle drawn for each particle image, the length of the longer side is taken as a value of a major axis, the length of the shorter side is taken as a value of a minor axis, and a value obtained by dividing the value of the major axis by the value of the minor axis, that is, the major axis/minor axis ratio, is calculated as the aspect ratio. By arithmetically averaging the aspect ratios of the predetermined number of particles, the average aspect ratio can be obtained.

<Surface Protective Agent>

The polishing composition disclosed herein comprises, as a surface protective agent, a cellulose derivative and a vinyl alcohol-based dispersant. The surface protective agent may be formed so as to have a dispersibility parameter α described hereinafter of less than 100, (Dispersibility Parameter α)

The dispersibility parameter α of the surface protective agent is calculated according to the following equation with a filtration time $T_0$ of 100 g of a standard solution containing a standard polymer and ammonia, the remainder being water and a filtration time $T_1$ of 100 g of a test solution containing the surface protective agent and ammonia, the remainder being water in vacuum filtration conducted according to a predetermined method:

$$\text{Dispersibility parameter } \alpha[\%]=(T_1/T_0)\times 100$$

Both the standard solution and the test solution have an ammonia concentration of 0.1% by weight. The standard polymer used is a hydroxyethyl cellulose (HEC) having a weight average molecular weight (Mw) of $25\times 10^4$. The standard solution has a concentration of the standard polymer of 0.17% by weight. The concentration of the surface protective agent in the test solution is adjusted so that the concentration of the cellulose derivative in the surface protective agent is 0.17% by weight.

The filtration times $T_0$ and $T_1$ are measured as indicated below.

[Conditions for Vacuum Filtration]

Filter Used:
  Type: membrane filter (φ47 mm, disc type)
  Material: nylon
  Pore diameter: 0.2 μm
Vacuum pressure: 0.005 MPa

[Measurement Procedures of Filtration Time1]

A membrane filter is attached to a vacuum filtration machine, 100 g of deionized water is subjected to vacuum filtration at the vacuum pressure indicated above and 100 g of the standard solution is then subjected to vacuum filtration. The time $T_0$ (filtration time) required for filtration of 100 g of the standard solution is measured.

The membrane filter then is replaced with a new one, 100 g of deionized water is subjected to vacuum filtration at the vacuum pressure indicated above and 100 g of the test solution is then subjected to vacuum filtration. The time $T_1$ (filtration time) required for filtration of 100 g of the test solution is measured.

α determined as above may be a useful index for estimating an extent of dispersibility of the cellulose derivative in the polishing composition including the surface protective agent. With the surface protective agent having α of less than 100% allows appropriate dispersion of the cellulose derivative included in the surface protective agent in the polishing composition and may efficiently prevent defects resulting from aggregates that may be included in the cellulose derivative. In some embodiments, α may be 99% or less such as 98% or less. The surface protective agent having α of 96% or less may exhibit higher effects. The art disclosed herein may be preferably implemented in an embodiment wherein α is 90% or less or 85% or less such as 80% or less. The lower limit of α is not particularly limited and may be, for example, 10% or more. From the viewpoint of better exploitation of a protective effect and an effect of improving surface wettability by the cellulose derivative, α is usually suitably 30% or more and may be 50% or more or 60% or more such as 70% or more. α may be adjusted by selection of the types and the molecular weights of constituents of the surface protective agent and the ratio between the amounts of the constituents.

(Cellulose Derivative)

The cellulose derivative is a polymer containing main repeating units of β-glucose. Specific examples of the cellulose derivative include hydroxyethyl cellulose (HEC), hydroxypropyl cellulose, hydroxyethyl methyl cellulose, hydroxypropyl methyl cellulose, methylcellulose, ethylcellulose, ethyl hydroxyethyl cellulose, carboxymethyl cellulose, and the like, among which HEC is preferable.

The Mw of the cellulose derivative used in the polishing composition disclosed herein is not particularly limited and may be, for example, $2\times 10^4$ or more. From the viewpoint of suitable exhibition of functions such as protective ability and surface wettability, the Mw of the cellulose derivative is usually suitably $5\times 10^4$ or more and may be $7\times 10^4$ or more, $10\times 10^4$ or more or $15\times 10^4$ or more such as $20\times 10^4$ or more. The Mw of the cellulose derivative may be, for example, $100\times 10^4$ or less and from the viewpoint of improving dispersibility, is preferably $70\times 10^4$ or less and still more preferably $50\times 10^4$ or less. In one embodiment, a cellulose derivative having a Mw of less than $50\times 10^4$, more preferably less than $30\times 10^4$ such as $28\times 10^4$ or less may be preferably used.

In the present specification, the weight average molecular weight (Mw) of a water-soluble organic substance that may be included in the polishing composition may be a value based on gel permeation chromatography (GPC) (aqueous system, in terms of polyethylene oxide).

The proportion of the cellulose derivative in the surface protective agent is not particularly limited and may be, for example, 20% by weight or more. The proportion may be, for example, 20% by weight or more and less than 100% by weight. From the viewpoint of better exploitation of the effect due to use of the cellulose derivative, the proportion is usually suitably 30% by weight or more and may be 50% by weight or more. The art disclosed herein may be preferably implemented in an embodiment wherein the proportion of the cellulose derivative in the surface protective agent is above 50% by weight. The proportion of the cellulose derivative may be 60% by weight or more, 70% by weight or more or 80% by weight or more. From the viewpoint of exploitation of the effect due to use of the vinyl alcohol-based dispersant, the proportion of the cellulose derivative in the surface protective agent is usually suitably 99.9% by weight or less and may be 99.5% by weight or less, 99% by weight or less or 98.5% by weight or less. In one embodiment, the proportion of the cellulose derivative in the surface protective agent may be 95% by weight or less or 90% by weight or less.

Without particular limitation, the content of the cellulose derivative in the polishing composition may be, for example, 0.1 g or more or 0.5 g or more per 100 g abrasive in the polishing composition. From the viewpoint of better exploitation of the effect due to use of the cellulose derivative, the content is usually suitably 1 g or more and preferably 2 g or more. In one embodiment, the content may be 3 g or more or 4 g or more. In such an embodiment, the significance of application of the present application may be more effectively exhibited. From the viewpoint of filtration ability and cleanability of the polishing composition, the content of the cellulose derivative per 100 g abrasive is usually suitably 15 g or less and may be 12 g or less, 10 g or less or 8 g or less such as 6 g or less.

(Vinyl Alcohol-Based Dispersant)

The surface protective agent disclosed herein includes a vinyl alcohol-based dispersant. The vinyl alcohol-based dispersant may be hereinafter referred to as "dispersant VA". By using the cellulose derivative and the dispersant VA in combination, the dispersibility of the cellulose derivative in the polishing composition may be improved and defects (such as LPD-N) resulting from use of the cellulose derivative may be effectively reduced.

The dispersant VA used, is a water-soluble organic substance (typically water-soluble polymer) containing a vinyl alcohol unit as a repeating unit. The vinyl alcohol unit (hereinafter also referred to as "VA unit") is the structural moiety represented by the following chemical formula: —CH$_2$—CH(OH)—. The VA unit may be generated by hydrolysis (also referred to as saponification) of repeating units of a structure obtained by vinyl polymerization of a vinyl ester monomer such as vinyl acetate.

The dispersant VA may contain only a VA unit as the repeating unit or may contain a repeating unit (hereinafter also referred to as "non-VA unit") other than the VA unit in addition to the VA unit. In an embodiment wherein the dispersant VA contains a non-VA unit, the non-VA unit may be a repeating unit having at least one structure selected from an oxyalkylene group, a carboxy group, a sulfo group, an amino group, a hydroxy group, an amide group, an imide group, a nitrite group, an ether group, an ester group and salts thereof. The dispersant VA may be a random copolymer, a block copolymer or a graft copolymer containing a VA unit and a non-VA unit. The dispersant VA may contain only one type of non-VA unit, or two or more types of non-VA units.

The proportion in moles of the VA unit in all repeating units in moles that form the dispersant VA may be, for example, 5% or more, 10% or more, 20% or more or 30% or more. Without particular limitation, in some embodiments, the proportion in moles of the VA unit may be 50% or more, 65% or more, 75% or more, 80% or more or 90% or more such as 95% or more or 98% or more. Substantially 100% of the repeating units that, form the dispersant VA may be the VA unit. The phrase "substantially 100%" as used herein means that the dispersant VA does not include, at least intentionally, a non-VA unit. In some other embodiments, the proportion in moles of the VA unit in all repeating units in moles that form the dispersant VA may be, for example, 95% or less, 90% or less. 80% or less or 70% or less, The content of the VA unit in the dispersant VA may be, on the weight basis, for example 5% by weight or more, 10% by weight or more, 20% by weight or more or 30% by weight or more. Without particular limitation, in some embodiments, the content of the VA unit may be 50% by weight or more or above 50% by weight, 70% by weight or more, 80% by weight or more, 90% by weight or more, 95% by weight or more or 98% by weight or more. Substantially 100% by weight of the repeating units that form the dispersant VA may be the VA unit. The phrase "substantially 100% by weight" as used herein means that the dispersant VA does not include, at least intentionally, a non-VA unit, as a repeating unit that forms the dispersant VA. In some other embodiments, the content of the VA unit in the dispersant VA may be, for example, 95% by weight or less, 90% by weight or less, 80% by weight tar less or 70% by weight or less.

The dispersant VA may include a plurality of polymer chains that have different VA unit contents in one molecule. The polymer chain as used herein refers to a portion (segment) that forms a part of one polymer molecule. For example, the dispersant VA may include, in one molecule, a polymer chain A having a VA unit content of above 50% by weight and a polymer chain B having a VA unit content of less than 50% by weight. The polymer chain B having a VA unit content of less than 50% by weight is thus a polymer chain B having a non-VA unit content of above 50% by weight.

The polymer chain A may include only a VA unit as the repeating unit or may contain a non-VA unit in addition to a VA unit. The content of the VA unit in the polymer chain A may be 60% by weight or more, 70% by weight or more, 80% by weight or more or 90% by weight or more, in some embodiments, the content of the VA unit in the polymer chain A may be 95% by weight or more or 98% by weight or more. Substantially 100% by weight of the repeating units that form the polymer chain A may be the VA unit.

The polymer chain B may include only a non-VA unit as the repeating unit or may include a VA unit in addition to a non-VA unit. The content of the non-VA unit in the polymer chain B may be 60% by weight or more, 70% by weight or more, 80% by weight or more or 90% by weight or more. In some embodiments, the content of the non-VA unit in the polymer chain B may be 95% by weight or more or 98% by weight or more. Substantially 100% by weight of the repeating units that form the polymer chain B may be the non-VA unit.

Examples of the dispersant VA including the polymer chain A and the polymer chain B in one molecule include a block copolymer and graft copolymer containing the polymer chains. The graft copolymer may have a structure in which the polymer chain B (side chain) is grafted to the polymer chain A (main chain), or have a structure in which the polymer chain A (side chain) is grafted to the polymer chain B (main chain). In one embodiment, the dispersant VA having a structure in which the polymer chain B is grafted to the polymer chain A may be used.

Examples of the polymer chain B include a polymer chain containing, as the main repeating unit, a repeating unit derived from an N-vinyl type monomer and a polymer chain containing, as the main repeating unit, a repeating unit derived from an N-(meth)acryloyl monomer. As used herein, the phrase "main repeating unit" refers to a repeating unit that accounts for above 50% by weight unless otherwise stated.

One preferable example of the polymer chain B is a polymer chain containing an N-vinyl type monomer as the main repeating unit, namely an N-vinyl-based polymer chain. The content of the repeating unit derived from the N-vinyl type monomer in the N-vinyl-based polymer chain is typically above 50% by weight and may be 70% by weight or more, 85% by weight or more or 95% by weight or more. Substantially all repeating, units in the polymer chain B may be derived from the N-vinyl type monomer.

Examples of the N-vinyl type monomer include a monomer having a nitrogen-containing, heterocycle and an N-vinyl chain amide. The heterocycle may be, for example, a lactam ring. Specific examples of the N-vinyl lactam type monomer include N-vinyl pyrrolidone, piperidone, N-vinyl morpholinone, N-vinyl caprolactam. N-vinyl-1,3-oxazin-2-one, N-vinyl-3,5-morpholinedione and the like. Specific examples of the N-vinyl chain amide include N-vinyl acetamide, N-vinyl propionic acid amide, N-vinyl butyric acid amide and the like. The polymer chain B may be, for example, an N-vinyl-based polymer chain in which above 50% by weight such as 70% by weight or more, 85% by weight or more or 95% by weight or more of the repeating units therein are the N-vinyl pyrrolidone unit. Substantially all repeating units that form the polymer chain B may be the N-vinyl pyrrolidone unit.

Other examples of the polymer chain B include a polymer chain containing a repeating unit derived from an N-(meth)

acryloyl type monomer as the main repeating unit, namely an N-(meth)acryloyl-based polymer chain. The content of the repeating unit derived from the N-(meth)acryloyl type monomer in the N-(meth)acryloyl-based polymer chain is typically above 50% by weight and may be 70% by weight or more, 85% by weight or more or 95% by weight or more. Substantially all repeating units in the polymer chain B may be derived from the N-(meth)acryloyl type monomer.

Examples of the N-(meth)acryloyl type monomer include a chain amide having an N-meth)acryloyl group and a cyclic amide having an N-(meth)acryloyl group: Examples of the chain amide having an N-(meth)acryloyl group include (meth)acrylamide; an N-alkyl (meth)acrylamide such as N-methyl (meth)acrylamide, N-ethyl (meth)acrylamide, N-propyl (meth)acrylamide, N-isopropyl (meth)acrylamide and N-n-butyl (meth)acrylamide; N,N-dialkyl (meth)acrylamide such as N,N-dimethyl (meth)acrylamide, N,N-diethyl (meth)acrylamide, N,N-dipropyl (meth)acrylamide, N,N-di-isopropyl (meth)acrylamide and N,N-di(n-butyl) (meth)acrylamide; and the like. Examples of the cyclic amide having an N-(meth)acryloyl group include N-(meth)acryloylmorpholine, N-(meth)acryloylpyrrolidine and the like.

Other examples of the polymer chain B include a polymer chain containing an oxyalkylene unit as the main repeating unit, namely an oxyalkylene-based polymer chain. The content of the oxyalkylene unit in the oxyalkylene-based polymer chain is typically above 50% by weight and may be 70% by weight or more, 85% by weight or more or 95% by weight or more. Substantially all repeating units in the polymer chain B may be the oxyalkylene unit.

Examples of the oxyalkylene unit include an oxyethylene unit, an oxypropylene unit, an oxybutylene unit and the like. Each such oxyalkylene unit may be a repeating unit derived from the corresponding alkylene oxide. The oxyalkylene units included in the oxyalkylene-based polymer chain may be alone type or of two or more types. For example, the oxyalkylene-based polymer chain may include a combination of an oxyethylene unit and an oxypropylene unit in an oxyalkylene-based polymer chain containing two or more types of oxyalkylene units, the oxyalkylene units may be random copolymers, block copolymers or graft copolymers of corresponding alkylene oxides.

The weight average molecular weight (Mw) of the dispersant VA is not particularly limited and may be, for example, 2000 or more or above 5000. From the viewpoint of appropriate exhibition of an effect of improving dispersibility, the Mw of the dispersant VA may be 7000 or more, $1 \times 10^4$ or more or $1.2 \times 10^4$ or more. In one embodiment, the dispersant VA having an Mw of $2 \times 10^4$ or more such as $3 \times 10^4$ or more, $5 \times 10^4$ or more, or $7 \times 10^4$ or more may be preferably used. The Mw of the dispersant VA is usually suitably $100 \times 10^4$ or less and may be, for example, $50 \times 10^4$ or less, $30 \times 10^4$ or less or $20 \times 10^4$ or less. From the viewpoint of obtaining a higher effect of improving dispersibility, in one embodiment, the dispersant VA having a Mw of $17 \times 10^4$ or less such as $15 \times 10^4$ or less may be preferably used.

Without particular limitation, the surface protective agent disclosed herein may be preferably implemented in an embodiment containing a dispersant VA having an Mw that is lower than that of the cellulose derivative. According to the embodiment, an advantage due to use of the cellulose derivative tends to be preferably exhibited. In one embodiment, the Mw of the dispersant VA may be 90% or less, namely 0.9 times or less of the Mw of the cellulose derivative. The Mw of the dispersant VA may be 75% or less or 60% or less such as 50% or less of the Mw of the cellulose derivative. The Mw of the dispersant VA is usually suitably 0.5% or more and is preferably 1% or more of the Mw of the cellulose derivative. From the viewpoint of appropriate exhibition of an effect of improving dispersibility, in some embodiments, the Mw of the dispersant VA may be 2% or more, 3% or more, 5% or more, 10% or more, 20% or more or 30% or more of the Mw of the cellulose derivative.

The proportion of the dispersant VA in the surface protective agent is not particularly limited and may be adjusted so that a desired effect of improving dispersibility is obtained. In one embodiment, the proportion of the dispersant VA in the surface protective agent may be, for example, 0.05% by weight or more, and is usually suitably 0.1% by weight or more, and from the viewpoint of obtaining a higher effect of improving dispersibility, the proportion may be 0.5% by weight or more, 1% by weight or more or 1.5% by weight or more. The proportion of the dispersant VA in the surface protective agent may be, for example, 50% by weight or less, and from the viewpoint of appropriate exhibition of an effect due to use of the cellulose derivative, the proportion is usually suitably 30% by weight or less and may be 20% by weight or less, 15% by weight or less, 10% by weight or less such as 7% by weight or less. The art disclosed herein may also be preferably implemented in an embodiment in which the proportion of the dispersant VA in the surface protective agent is 5% by weight or less such as 4% by weight or less.

Without particular limitation, the content of the dispersant VA per 100 g cellulose derivative may be, for example, 0.1 g or more, 0.2 g or more, 0.5 g or more, 1 g or more, 1.5 g or more or 2 g or more. An increase of the content of the dispersant VA tends to provide a higher effect of improving dispersibility. The content of the dispersant VA per 100 g cellulose derivative may be, for example, 80 g or less, and from the viewpoint of better exhibition of an effect due to use of the cellulose derivative, the content is usually suitably 50 g or less, is preferably 30 g or less and may be 20 g or less, 15 g or less, 10 g or less or 7 g or less such as 5 g or less.

Without particular limitation, the content of the dispersant VA in the polishing composition may be, per 100 g abrasive in the polishing composition, for example, 0.0001 g or more, 0.0005 g or more, 0.001 g or more, 0.005 g or more, 0.01 g or more, 0.02 g or more, 0.05 g or more or 0.07 g or more. An increase of the content of the dispersant VA tends to provide a higher effect of improving dispersibility. In some embodiments, the content of the dispersant VA in the polishing composition may be, for example, 0.1 g or more, 0.2 g or more, 1.2 g or more or 2.5 g or more. From the viewpoint of cleanability and economic efficiency, the content of the dispersant VA per 100 g abrasive is usually suitably 10 g or less and may be 5 g or less. In some embodiments, the content of the dispersant VA in the polishing composition may be, for example, 3 g or less, 2 g or less, 1 g or less or 0.5 g or less.

Without particular limitation, the total content of the cellulose derivative and the dispersant VA in the polishing composition may be, per 100 g abrasive in the polishing composition, for example 1.1 g or more, is usually suitably 1.5 g or more and may be 2 g or more, 2.5 g or more, 3 g or more, 3.5 g or more or 4 g or more. An increase of the total content tends to provide a higher effect of improving dispersibility. In some embodiments, the total content may be 7 g or more or 10 g or more. From the point of cleanability and economic efficiency, the total content of the cellulose derivative and the dispersant VA per 100 g abrasive is usually suitably 30 g or less, is preferably 20 g or less and may be 15 g or less. In some embodiments, the total content may be, for example, 12 g or less or 10 g or less. The art disclosed herein may be preferably implemented in an embodiment in which the total content of the cellulose derivative and the dispersant VA per 100 g abrasive is 8 g or less (such as 6 g or less).

(Oxyalkylene-Based Additive)

The surface protective agent of the art disclosed herein may optionally further include an oxyalkylene-based additive. The oxyalkylene-based additive that may be suitably used is a water-soluble organic substance having a structure including above 50% by (eight of oxyalkylene units. The oxyalkylene-based additive that may be used be one type of such a water-soluble organic substance or a combination of two or more types thereof. A nonionic water-soluble organic substance is preferable. The oxyalkylene-based additive may be hereinafter also referred to a "additive OA".

Examples of the water-soluble organic substance that may be used as the additive OA include polyethylene oxide (PEO), a block copolymers of ethylene oxide (EO) and propylene oxide (PO) or butylene oxide (BO), a random copolymer of EO and PO or BO and the like. Among others, a block copolymer of EO and PO and a random copolymer of EO and PO are preferred. The block copolymer of EO and PO may be diblock copolymer or a triblock copolymer including a PEO block and a polypropylene oxide (PPO) block. Examples of the triblock copolymer include a PEO-PPO-PEO triblock copolymer and a PPO-PEO-PPO triblock copolymer. Usually, a PEO-PPO-PEO triblock copolymer is more preferable. In block copolymers or random copolymers of EO and PO, the molar ratio (EO/PO) between EO and PO that form the copolymers is preferably above 1, more preferably 2 or more, still more preferably 3 or more and may be, for example, 5 or more from the viewpoint of solubility in water and cleanability.

Other examples of the water-soluble organic substance that may be used as the additive OA include oxyalkylene polymers such as polyethylene glycol, polypropylene glycol and polytetramethylene glycol; polyoxyalkylene derivatives, for example, polyoxyalkylene adducts such as polyoxyethylene alkyl ethers, polyoxyethylene alkyl phenyl ethers, polyoxyethylene alkyl amities, polyoxyethylene fatty acid esters, polyoxyethylene glyceryl ether fatty acid esters and polyoxyethylene sorbitan fatty acid esters. Suitable examples include polyethylene glycol and polyoxyethylene alkyl ethers. The polyoxyethylene alkyl ether may be, for example, polyoxyethyelene decyl ether.

Specific examples of the polyoxyalkylene derivatives include polyoxyethylene propyl ether, polyoxyethylene butyl ether, polyoxyethylene pentyl ether, polyoxyethylene hexyl ether, polyoxyethylene octyl ether, polyoxyethylene-2-ethylhexyl ether, polyoxyethylene nonyl ether, polyoxyethylene decyl ether, polyoxyethylene isodecyl ether, polyoxyethylene tridecyl ether, polyoxyethylene lauryl ether, polyoxyethylene cetyl ether, polyoxyethylene stearyl ether, polyoxyethylene isostearyl ether, polyoxyethylene oleyl ether, polyoxyethylene phenyl ether, polyoxyethylene octyl phenyl ether, polyoxyethylene nonyl phenyl ether, polyoxyethylene dodecyl phenyl ether, polyoxyethylene styrenated phenyl ether, polyoxyethylene lauryl amine, polyoxyethylene stearyl amine, polyoxyethylene oleyl amine, polyoxyethylene monolauric acid ester, polyoxyethylene monostearic acid ester, polyoxyethylene distearic acid ester, polyoxyethylene monooleic acid ester, polyoxyethylene dioleic acid ester, polyoxyethylene sorbitan monolaurate, polyoxyethylene sorbitan monopalmitate, polyoxyethylene sorbitan monostearate, polyoxyethylene sorbitan monooleate, polyoxyethylene sorbitan trioleate, polyoxyethylene sorbit tetraoleate, polyoxyethylene castor oil, polyoxyethylene hydrogenated castor oil and the like.

The weight average molecular weight (Mw) of the additive OA is not particularly limited, and from the viewpoint of dispersibility, the Mw is usually suitably $10 \times 10^4$ or less and may be, for example, $5 \times 10^4$ or less, $3 \times 10^4$ or less, $2 \times 10^4$ or less, $1 \times 10^4$ or less or 9500 or less such as less than 9000. From the viewpoint of improving surface quality after polishing, the Mw of the additive OA is usually suitably 200 or more and may be 250 or more such as 300 or more. The range of more preferable Mw of the additive OA may vary according to the type of the additive OA. For example, when the additive OA used is a polyoxyethylene alkyl ether or an oxyalkylene polymer (such as polyethylene glycol), the Mw thereof is preferably less than 5000 and may be 2500 or less such as 1000 or less. When the additive OA used is, for example, a PEO-PPO-PEO triblock copolymer, the Mw thereof may be, for example, 1000 or more, 3000 or more or 5000 or more.

The proportion of the additive OA in the surface protective agent is not particularly limited. The proportion may be, for example, 0.05% by weight or more or 0.5% by weight or more, and from the viewpoint of obtaining a higher effect due to use, the proportion may be 1% by weight or more or 5% by weight or more. From the viewpoint of appropriate exhibition of the effect due to use of the cellulose derivative, the proportion of the additive OA in the surface protective agent is usually suitably 30% by weight or less and may be 25% by weight of less, 20% by weight or less or 15% by weight or less.

Without particular limitation, the content of the additive OA per 100 g cellulose derivative may be, for example, 0.1 g or more, 1 g or more or 3 g or more. From the viewpoint of appropriate exhibition of the effect due to use of the cellulose derivative, the content of the additive OA per 100 g cellulose derivative is usually suitably 100 g or less and may be 70 g or less. 50 g or less, 30 g or less, 20 g or less or 15 g or less.

Without particular limitation, the content of the additive OA in the polishing composition may be, for, example. 0.0001 g or, more, 0.01 g or more or 0.05 g or more per 100 g abrasive in the polishing composition. The content of the additive OA per 100 g abrasive is usually suitably 5 g or less and may be 3 g or less or 1 g or less.

Without particular limitation, the content of the additive OA per 1 g dispersant VA may be, for example, 0.01 g or more, 0.1 g or more or 0.3 g or more. The content of the additive OA per 1 g dispersant VA is usually suitably 20 g or less and may be 15 g or less, 10 g or less, 5 g or less or 1 g or less.

In one embodiment of the art disclosed herein, the surface protective agent may include a combination of the dispersant VA and an oxyalkylene-based additive (additive $OA_L$) having a weight average molecular weight (Mw) of less than 5000. By using the additive $OA_L$, surface defects such as the number of LPD-N after polishing may be further reduced. The additive $OA_L$ used may be materials having a Mw of less than 5000 among those exemplified as the water-soluble organic substances that may be used as the additive OA. The Mw the additive $OA_L$ may be 2500 or less, 1000 or less such as 800 or less. From the viewpoint of appropriate exhibition of an effect of reducing surface defects, the Mw of the additive $OA_L$ is suitably 200 or more and may be 250 or more such as 300 or more. In one embodiment, the additive $OA_L$ having Mw of 350 or more may be used. Unlimited examples of the material that may be preferably used as the additive $OA_L$ may include an oxyalkylene polymer and a polyoxyethylene alkyl ether. The oxyalkylene polymer may be, for example, polyethylene glycol. The polyoxyethylene alkyl ether may be, for example, polyoxyethylene decyl ether.

Without particular limitation, the content of the additive $OA_L$ per 1 g dispersant VA may be, for example, 0.01 g or more, 0.05 g or more, 0.1 g or more or 0.3 g or more. The content of the additive OA per 1 g dispersant VA is usually suitably 10 g or less and may be 5 g or less, 3 g or less, 2 g or less or 1 g or less such as 0.7 g or less.

<Basic Compound>

The basic compound may be appropriately selected from various basic compounds that have a function of raising the pH of aqueous solutions in which the compounds are dissolved. For example, an organic or inorganic basic compound containing nitrogen, an alkali metal hydroxide, an alkaline earth metal hydroxide, various carbonates, bicarbonates and the like may be used. Examples of the nitrogen-containing basic compound include a quaternary ammonium compound, a quaternary phosphonium compound, ammonia, an amine and the like. As the amine, a water-soluble amine is preferable. Such basic compounds may be used singly or in combination of two or more types thereof.

Specific examples of the alkali metal hydroxide include potassium hydroxide, sodium hydroxide and the like. Specific examples of the carbonate and bicarbonate include ammonium hydrogen carbonate, ammonium carbonate, potassium hydrogen carbonate, potassium carbonate, sodium hydrogen carbonate, sodium carbonate and the like. Specific examples of the amine include methylamine, dimethylamine, trimethylamine, ethylamine, diethylamine, triethylamine, ethylenediamine, monoethanolamine, N-(β-aminoethyl) ethanolamine, hexamethylenediamine, diethylenetriamine, triethylenetetramine, piperazine anhydride, piperazine hexahydrate, 1-(2-aminoethyl) piperazine, N-methylpiperazine, guanidine, azoles such as imidazole and triazole and the like. Specific examples of the quaternary phosphonium compound include a quaternary phosphonium hydroxide such as tetramethylphosphonium hydroxide and tetraethylphosphonium hydroxide.

A quaternary ammonium salt such as a tetraalkylammonium salt or a hydroxyalkyltrialkylammonium salt may be preferably used as the quaternary ammonium compound. The anion component the quaternary ammonium salt may be, for example, $OH^-$, $F^-$, $Cl^-$, $Br^-$, $I^-$, $ClO_4^-$ and $BH_4^-$. The quaternary ammonium salt is preferably a strong base. Among others, a quaternary ammonium salt with $OH^-$ as an anion, that is, a quaternary ammonium hydroxide may be mentioned as, a preferable example. Specific examples of the quaternary ammonium hydroxide, include a tetraalkylammonium hydroxide such as tetramethylammonium hydroxide, tetraethylammonium hydroxide, tetrapropylammonium hydroxide, tetrabutylammonium hydroxide, tetrapentylammonium hydroxide and tetrahexylammonium hydroxide; a hydroxyalkyltrialkylammonium hydroxide such as 2-hydroxyethyltrimethylammonium hydroxide (also referred to as choline); and the like. Among others, tetraalkylammonium hydroxides are preferred, and tetramethylammonium hydroxide (TMAH) is more preferred.

The basic compound in the art disclosed herein is preferably at least one basic compound selected from an alkali metal hydroxide, a quaternary ammonium hydroxide and ammonia. Among others, a quaternary ammonium hydroxide such as tetramethylammonium hydroxide and ammonia are more preferred, and ammonia is particularly preferred.

<Water>

The polishing composition disclosed herein typically contains water. Ion exchanged water (deionized water), pure water, ultrapure water, distilled water and the like may be preferably used as the water. In order to minimize the inhibition of the action of other components contained in the polishing composition, it is preferable that the total content of transition metal ions in the water used be, for example, 100 ppb or less. For example, the purity of water may be increased by operations such as removal of impurity ions with an ion exchange resin, removal of contaminants with a filter and distillation.

<Other Components>

The polishing composition disclosed herein may optionally contain a well-known additive that may be used in polishing compositions such as a chelating agent, an organic acid, an organic acid salt, an inorganic acid, an inorganic acid salt, an antiseptic agent and an antifungal agent, in the range that does not significantly impair the effects of the present invention. The polishing composition disclosed herein may be preferably implemented in an embodiment that does not substantially include a chelating agent. The additive may be, for example, a well-known additive that may be used for polishing compositions that are used in the polishing step of silicon substrates.

It is preferable that the polishing composition disclosed herein be substantially free of an oxidizing agent. This is because the polishing removal rate can be lowered due to an oxide layer generated by oxidizing the surface of the polishing object while the polishing composition is supplied to the polishing of object in polishing the polishing object which is a silicon substrate such as a silicon wafer when the polishing composition includes an oxidizing agent. Specific examples of the oxidizing agent as used herein include hydrogen peroxide ($H_2O_2$), sodium persulfate, ammonium persulfate, sodium dichloroisocyanurate and the like. The polishing composition being substantially free of the oxidizing agent means that an oxidizing agent is not included at least intentionally.

The polishing composition disclosed herein may contain, as an optional component, a water-soluble polymer (hereinafter also referred to as "optional polymer") other than the cellulose derivative and the dispersant VA in the range that does not significantly impair the effects of the present invention. For example, a starch derivative, an N-vinyl type polymer, an N-(meth)acryloyl type polymer and the like may be used as the optional polymer. Examples of the starch derivative include pregelatinized starch, carboxymethyl starch, cyclodextrin and the like. The N-vinyl type polymer may be a homopolymer or copolymer of N-vinyl type monomers exemplified above for the polymer chain B. Specific examples of the N-vinyl type polymer include a homopolymer of N-vinyl pyrrolidone (VP), a copolymer having a copolymerization ratio of VP of 70% by weight or more and the like. The N-(meth)acryloyl type polymer may be a homopolymer or copolymer of N-(meth)acryloyl type monomers exemplified above for the polymer chain B. Specific examples of the N-(meth)acryloyl type polymer include a homopolymer of N-isopropylacrylamide (NIPAM), a copolymer having a copolymer having a copolymerization ratio of NIPAM of 70% by weight or more, a homopolymer of N-acryloylmorpholine (ACMO), a copolymer having a copolymerization ratio of ACMO of 70% by weight or more and the like. The optional polymer is preferably nonionic. The content of the optional polymer is suitably 30 g or less, is preferably 10 g or less and may be 5 g or less or 1 g or less per 100 g cellulose derivative. The art disclosed herein may be preferably implemented in an embodiment that does not substantially contain the optional polymer.

<pH>

The pH of the polishing composition disclosed herein is usually suitably 8.0 or more, preferably 8.5 or more, more preferably, 9.0 or more and still more preferably 9.5 or more such as 10.0 or more. When the pH of the polishing composition increases, the polishing removal rate tends to be improved. Meanwhile, from the viewpoint of preventing dissolution of the abrasive such as silica particles and suppressing weakening of the mechanical polishing effect by the abrasive, the pH of the polishing composition is suitably 12.0 or less, preferably 11.8 or less, more preferably 11.5 or less and still more preferably 11.0 or less.

In the art disclosed herein, the pH of the liquid composition can be grasped by performing three-point calibration using a standard buffer solution by using a pH meter, placing a glass electrode in the composition to be measured, and measuring a pH value, after the composition has been stabilized for 2 min or longer. Examples of standard buffer solutions include a phthalate pH buffer solution, pH: 4.01 (25° C.), a neutral phosphate pH buffer solution, pH: 6.86 (25° C.), and a carbonate pH buffer solution, pH: 10.01 (25° C.). For example, a glass electrode type hydrogen ion concentration indicator manufactured by Horiba Ltd., model number F-23 or equivalent thereof can be used as the pH meter.

<Application>

The polishing composition according to the art disclosed herein can be used in polishing of polishing objects of various materials and shapes. Examples of materials of the polishing object include metals or metalloids such as silicon, aluminum, nickel, tungsten, copper, tantalum, titanium, stainless steel or the like or an alloy thereof; a glassy material such as quartz glass, aluminosilicate glass, glassy carbon and the like; ceramic materials such as alumina, silica, sapphire, silicon nitride, tantalum nitride, titanium carbide and the like; compound semiconductor substrate materials such as silicon carbide, galliumnitride, gallium arsenide and the like; resin materials such as polyimide resin and the like; and the like. A polishing object composed of a plurality of materials among them may be also polished.

The polishing composition according to the art disclosed herein can be particularly preferably used for polishing a surface made of silicon, such as a silicon wafer and the like. A typical example of the silicon wafer referred to herein is a silicon single crystal wafer, for example, a silicon single crystal wafer obtained by slicing a silicon single crystal ingot.

The polishing composition disclosed herein cam be preferably used in a polishing step of a polishing object, for example, a polishing step of a silicon wafer. Prior to the polishing step using the polishing composition disclosed herein, the polishing object may be subjected to a general treatment that can be applied to the polishing object in a step upstream of the polishing step such as lapping or etching.

The polishing composition disclosed herein can preferably used, for example, in polishing of a polishing object, for example, a silicon wafer, which has been prepared to have a surface state with a surface roughness of 0.01 nm to 100 nm in an upstream step. The surface roughness Ra of the polishing object can be measured using, for example, a laser scanning type surface roughness meter "TMS-3000WRC" manufactured by Schmitt Measurement Systems Inc. The use of the polishing composition in final polishing or polishing immediately therebefore is effective, and the use thereof in final polishing is particularly preferred. Here, the final polishing refers to the last polishing step in the process of manufacturing the object, that is, a step after which no further polishing is performed.

<Polishing Composition>

Typically, the polishing composition disclosed herein is supplied to a polishing object in the form of a polishing liquid including the polishing composition, and is used for polishing the polishing object. The polishing liquid may be prepared, for example, by diluting any of the polishing compositions disclosed herein. The dilution of the polishing composition can typically be carried out with water. Alternatively, the polishing composition may be used as it is as a polishing liquid. That is, the concept of a polishing composition in the art disclosed herein is inclusive of a polishing liquid (also referred to as working slurry) that is supplied to a polishing object and used for polishing the polishing object, and a concentrate that is used as a polishing liquid after dilution. The concentrate can also be grasped as a stock solution of a polishing liquid. Another example of the polishing liquid including the polishing composition disclosed herein includes a polishing liquid prepared by adjusting the pH of the composition.

Polishing Liquid

The content of the abrasive in the polishing liquid is not particularly limited, and is typically 0.01% by weight or more, preferably 0.05% by weight or more and more preferably 0.10% by weight or more such as 0.13% by weight or more. A higher polishing removal rate may be achieved by increasing the content of the abrasive. From the viewpoint of achieving a surface having a lower haze, the content is usually suitably 10% by weight or less, preferably 7% by weight or less, more preferably 5% by weight or less and still more preferably 2% by weight or less such as 1% by weight or less and may be 0.5% by weight or less or 0.3% by weight or less.

The concentration of the surface protective agent in the polishing liquid is not particularly limited and may be, for example, 0.0005% by weight or more. From the viewpoint of obtaining a higher protective effect, the preferable concentration is 0.001% by weight or more and more preferably 0.002% by weight or more, in some embodiments, the concentration of the surface protective agent may be, for example, 0.003% by weight or more or 0.005% by weight or more. The concentration of the surface protective agent may be, for example, 1.0% by weight or less, is usually suitably 0.5% by weight or less and may be 0.1% by weight or less and 0.05% by weight or less such as 0.02% by weight or less.

The concentration of the cellulose derivative in the polishing liquid is not particularly limited and may be, for example, 0.0001% by weight or more. From the viewpoint of haze reduction and the like, the preferable concentration is 0.0005% by weight or more, more preferably 0.001% by weight or more such as 0.003% by weight or more and may be 0.005% by weight or more. From the viewpoint of polishing removal efficiency and the like, the concentration of the cellulose derivative is usually preferably 0.2% by weight or less, and more preferably 0.1% by weight or less and may be 0.05% by weight or less such as 0.01% by weight or less.

The concentration of the dispersant VA in the polishing liquid is not particularly limited and may be, for example, 0.00001% by weight or more. From the viewpoint of obtaining a higher effect of improving dispersibility, the concentration may be 0.00005% by weight or more or 0.0001% by weight or more. In some embodiments, the concentration of the dispersant VA may be 0.0005% by weight or more or 0.001% by weight or more. From the viewpoint of the polishing removal efficiency and the like, the concentration of the dispersant VA is usually preferably 0.1% by weight or less and may be 0.01% by weight or less, 0.005% by weight or less and 0.001% by weight or less such as 0.0005% by weight or less.

When the polishing composition disclosed herein contains the basic compound, the concentration of the basic compound in the polishing liquid, is not particularly limited. From the viewpoint of improving the polishing removal rate and the like, it is usually preferable that the concentration is 0.0005% by weight or more and more preferably 0.001% by weight, or more of the polishing liquid. From the viewpoint of haze reduction and the like, the concentration is suitably less than 0.3% by weight, preferably less than 0.1% by weight and more preferably less than 0.05% by weight (such as less than 0.03% by weight).

(Concentrate)

The polishing composition disclosed herein may be in a concentrated form before being supplied to the polishing object. The concentrated form is the form of a concentrate of a polishing liquid and can be grasped as a stock solution of a polishing liquid. The polishing composition in such a concentrated form is suitable from the viewpoints of convenience in manufacturing, distribution, storage and the like, cost reduction and the like. The concentration factor is not particularly limited, and can be, for example, about 2 times to 100 times in terms of volume, usually suitably about 5 times to 50 times, for example, about 10 times to 40 times.

Such a concentrated liquid can be used in such a manner as to be diluted at a desired timing to prepare a polishing liquid (working slurry) and supply the polishing liquid to the polishing object. The dilution can be carried out, for example, by adding water to the concentrate and mixing.

The content of the abrasive in the concentrate may be, for example, 50% by weight or less. From the viewpoint of the handling properties of the concentrate such as dispersion stability of the abrasive and filterability, the content of the abrasive in the concentrate is usually preferably 45% by weight or less and may be 40% by weight or less such as 30% by weight or less. From the viewpoint of convenience in production, distribution, storage and the like, cost reduction and the like, the content of the abrasive may be, for example, 0.5% by weight or more, is preferably 1% by weight or more and may be 2% by weight or more or 3% by weight or more.

(Preparation of Polishing Composition)

The polishing composition used in the art disclosed herein may be in a one-agent type or a multi-agent type such as a two-agent type, for example, the polishing liquid can be prepared by mixing a part A including at least the abrasive among the constituent components of the polishing composition and a part B including at least a part of the remaining components, and these are mixed and diluted at an appropriate timing as needed.

A method for preparing the polishing composition is not particularly limited. For example, the components constituting the polishing composition may be mixed using a well-known mixing device such as a blade stirrer, an ultrasonic disperser, a homomixer or the like. The mode of mixing these components is not particularly limited, and for example, all the components may be mixed at once or may be mixed in a properly set order.

<Polishing>

The polishing composition disclosed herein can be used for polishing a polishing object in a mode including, for example, the following operations. Hereinafter, a favorable embodiment of a method for polishing a polishing object, for example, a silicon wafer, by using the polishing composition disclosed herein will be described.

Thus, a polishing liquid including any of the polishing compositions disclosed herein is prepared. Preparing the polishing liquid may additionally include the operation of adjusting the concentration of the polishing composition, for example, by dilution, or adjusting the pH. Alternatively, the polishing composition may be used as it is as a polishing liquid.

Next, the polishing liquid is supplied to the polishing object and polishing is performed by a conventional method. For example, in the case of final polishing a silicon wafer, typically, the silicon wafer that has been subjected to lapping is set in a general polishing machine and a polishing liquid is supplied to the surface to be polished of the silicon wafer through a polishing pad of the polishing machine. Typically, the polishing pad is pressed against the surface to be polished of the silicon wafer and the two are moved, for example, rotated, relative to each other while continuously supplying the polishing liquid. Through this polishing step, the polishing of the polishing object is completed.

The polishing pad used in the polishing step is not particularly limited. For example, a polishing pad of a foamed polyurethane type, a nonwoven fabric type, a suede type or the like can be used. Each polishing pad may or may not include abrasive. Usually, a polishing pad not including abrasive is preferably used.

The polishing object polished using the polishing composition disclosed herein is typically cleaned. Cleaning can be carried out using, an appropriate cleaning solution. The cleaning solution to be used is not particularly limited, and for example, an SC-1 cleaning solution, an SC-2 cleaning solution and the like generally used in the field of semiconductors and the like can be used. The SC-1 cleaning solution is a mixed solution of ammonium hydroxide ($NH_4OH$), hydrogen peroxide ($H_2O_2$), and water ($H_2O$). The SC-2 cleaning solution is a mixed solution of HCl, $H_2O_2$ and $H_2O$. The temperature of the cleaning solution can be, for example, in a range from room temperature to about 90° C. The room temperature is typically about 15° C. to 25° C. From the viewpoint of improving the cleaning effect, a cleaning solution at about 50° C. to 85° C. can be preferably used.

EXAMPLES

Several examples relating to the present invention will be described below, but the present invention is not intended to be limited to these examples. In the following description, "%" is on a weight basis except for the numerical values indicating the dispersibility parameter.

<Preparation of Polishing Compositions>

Example 1

A polishing composition was prepared including, in ion exchanged water, 0.175% of colloidal silica having a BET diameter of 25 nm, 0.00125% of a PEO-PPO-PEO block copolymer having a Mw of 9000 and 0.005% of ammonia and further 0.0085% of hydroxyethyl cellulose (HEC) having a Mw of $25 \times 10^4$ and 0.0003% of polyvinyl alcohol (PVA, saponification degree: 95% or more) having a Mw of 13000.

Example 2

A polishing composition of the present example was prepared in the same manner as in Example 1 except that a PVA having a Mw of 106000 was used instead of the PVA having a Mw of 13000 in Example 1.

Example 3

A polishing composition of the present example was prepared in the same manner as in Example 1 except that, instead, of the PVA in Example 1, a graft copolymer (hereinafter referred to as "PVA-g-PVP") that had polyvinyl alcohol (PVA) with a saponification degree of 95% or more as a main chain and polyvinyl pyrrolidone (PVP) as a side chain and had a Mw of 175000.

Example 4

A polishing composition of the present example was prepared in the same manner as in Example 1 except that the concentration of the PVA in Example 1 was changed to 0.0002% and polyethylene glycol (PEG) having a Mw of 600 was further added at a concentration of 0.0001%.

Example 5

A polishing composition was prepared including, in ion exchanged water, 0.088% of colloidal silica having a BET diameter of 25 nm, 0.0006% of polyoxyethylene decyl ether having a Mw of 400 and 0.006% of ammonia and further 0.0075% of HEC having a Mw of $25 \times 10^4$ and 0.004% of polyvinyl alcohol (PVA, saponification degree: 95% or more) having a Mw of 106000.

Comparative Example 1

A polishing composition of the present example was prepared in the same manner as in Example 1 except that PVA was not used.

Comparative Example 2

A polishing composition of the present example was prepared in the same manner as in Example 1 except that polyvinyl pyrrolidone (PVP) having a Mw of 45000 was used instead of the PVA in Example 1.

Comparative Examples 3 and 4

Polishing compositions of the present examples were prepared in the same manner as in Examples 1 and 2, respectively, except that HEC was not used.

For each of the polishing compositions of Examples and Comparative Examples above, the dispersibility parameter α was measured according to the method described above. The test solutions for Example 1 to 3 and Comparative Examples 1 and 2 contained the surface protective agent in the polishing compositions of the respective examples at such concentrations that the concentration of HEC that formed the surface protective agent was 0.17 and 0.1% ammonia, the remainder being water. Specifically, for Examples 1 and 2, a test solution used contained 0.17% of HEC, 0.006% of PVA having a Mw of 13000 or 106000, 0.025% PEO-PPO-PEO and 0.1% of ammonia, the remainder being water. For Example 3, a test solution used contained 0.17% of HEC, 0.006% of PVA-g-PVP, 0.025 of PEO-PPO-PEO and 0.1% of ammonia, the remainder being water. For Example 4, a test solution used contained 0.17% of HEC, 0.004% of PVA, 0.002% of PEG, 0.025% of PEO-PPO-PEO and 0.1% of ammonia, the remainder being water. For Example 5, a test solution used contained 0.17% of HEC, 0.091% of PVA, 0.014% of C10PEO and 0.1% of ammonia, the remainder being water. For Comparative Example 1, a test solution used contained 0.17% of HEC, 0.025% of PEO-PPO-PEO and 0.1% of ammonia, the remainder being water. For Comparative Example 2, a test solution used contained 0.17% of HEC, 0.025% of PEO-PPO-PEO, 0.006% of PVP and 0.1% of ammonia, the remainder being water. The results are indicated in Table 1. For Comparative Examples 3 and 4 without HEC, the measured values for test solutions which had compositions of the test solutions used for the measurement of dispersibility parameter α of the polishing compositions of Examples 1 and 2 from which HEC was omitted, namely test solutions containing 0.006% of PVA having a Mw of 13000 or 106000, 0.025% of PEO-PPO-PEO and 0.1% of ammonia, the remainder being water were indicated in brackets as reference values.

<Polishing of Silicon Wafers>

(1) Stock Polishing Step

A stock polishing composition containing 0.95% abrasive and 0.065% basic compound, the remainder being water was prepared. The abrasive used was colloidal silica having a BET diameter of 35 nm. The basic compound used was potassium hydroxide (KOH). A silicon wafer as a polishing object was polished under the following polishing conditions 1 by using the stock polishing composition as it was as a polishing liquid (working slurry). A commercially available silicon single crystal wafer (conductive type: P type, crystal orientation: <100>, resistivity: 1 Ω·cm or more and less than 100 Ω·cm, COP free) with a diameter of 200 mm after lapping and etching was used as the silicon wafer.

[Polishing Conditions 1]
Polishing machine: single wafer polishing machine manufactured by Okamoto Machine Tool Works, Ltd, model "PNX-322"
Polishing pressure: 15 kPa
Platen rotational speed: 30 rpm
Carrier rotational speed: 30 rpm
Polishing pad: manufactured by Fujibo Ehime Ltd., Co., Ltd., product name "FP55"
Flow rate of polishing liquid: 0.55 liter/min
Temperature of polishing liquid: 20° C.
Temperature of platen cooling water: 20° C.
Polishing time: 3 min (2) Final Polishing Step The silicon wafers after the above stock polishing step were polished under the following polishing conditions 2 by using the polishing compositions of the above Examples and Comparative Examples as they were as polishing liquids (working slurries).

[Polishing Conditions 2]
Polishing machine: single wafer polishing machine manufactured by Okamoto Machine Tool Works, Ltd., model "PNX-322"
Polishing pressure: 15 kPa
Platen rotational speed: 30 rpm
Carrier rotational speed: 30 rpm
Polishing pad: polishing pad manufactured by Fujibo Ehime Co., Ltd., product name "POLYPAS 27 NX"
Flow rate of polishing liquid: 0.4 liter/min
Temperature of polishing liquid: 20° C.
Temperature of platen cooling water: 20° C.
Polishing time: 4 min The polished silicon wafers were removed from the polishing machine and cleaned (SC-1 cleaning) with a cleaning solution of $NH_4OH$ (29%):$H_2O_2$ (31%):deionized water (DIW)=1:1:15 (volume ratio). More specifically, two cleaning tanks were prepared, the cleaning liquid was accommodated in each of the first and second cleaning tanks and held at 60° C. and the polished silicon wafer was immersed in the first cleaning tank for 15 min, then rinsed in a tank with ultrapure water under ultrasonic vibrations, immersed in the second cleaning tank for 15 min and then dried with a spin dryer.

<Measurement of Number of LPD-N>

The number of LPD-N present on the surface (polished surface) of the silicon wafer obtained according to the above examples was measured using a wafer defect tester with the product name "SURFSCAN SP2" manufactured by KLA-Tencor Corporation, the measurement being carried out in the DCO mode of the same device. The measured number of LPD-N for the examples were converted to relative values with the number of LPD-N of Comparative Example 1 being 100%, and the number of LPD-N was evaluated according to the 6 grades indicated below on the basis of the converted values. The results are indicated in Table 1.

A: less than 40%
B: 40% or more and less than 50%
C: 50% or more and less than 60%
D: 60% or more and less than 100%
E: 100% or more and less than 150%
F: 150% or more

TABLE 1

|  | Cellulose derivative | | | Dispersant/additive | | | | Evaluation |
| --- | --- | --- | --- | --- | --- | --- | --- | --- |
|  | Type | Mw | Concentration (wt %) | Type | Mw | Concentration (wt %) | α (%) | of the number of LPD-N |
| Example 1 | HEC | 250000 | 0.0085 | PVA | 13000 | 0.0003 | 81 | B |
| Example 2 | HEC | 250000 | 0.0085 | PVA | 106000 | 0.0003 | 76 | B |
| Example 3 | HEC | 250000 | 0.0085 | PVA-g-PVP | 175000 | 0.0003 | 96 | C |
| Example 4 | HEC | 250000 | 0.0085 | PVA PEG | 106000 600 | 0.0002 0.0001 | 75 | A |
| Example 5 | HEC | 250000 | 0.0075 | PVA | 106000 | 0.004 | 90 | B |
| Comparative Example 1 | HEC | 250000 | 0.0085 | — | — | — | 100 | E |
| Comparative Example 2 | HEC | 250000 | 0.0085 | PVP | 45000 | 0.0003 | 108 | E |
| Comparative Example 3 | — | — | — | PVA | 13000 | 0.0003 | (32) | F |
| Comparative Example 4 | — | — | — | PVA | 106000 | 0.0003 | (36) | F |

As shown in Table 1, it was demonstrated that according to the polishing compositions of Examples 1 to 5 that contained the cellulose derivative and the vinyl alcohol-based dispersant and the surface protective agent S1 having dispersibility parameter α of less than 100, the number of LPD-N after final polishing was clearly reduced as compared with the polishing composition of Comparative Example 1. Meanwhile, according to the polishing composition of Comparative Example 2 having α of above 100 did not provide an effect of reducing the number of LPD-N. Comparative Examples 3 and 4, which were polishing compositions of Examples 1 and 2 from which the cellulose derivative was omitted had significantly reduced surface quality after final polishing.

Although specific examples of the present invention have been described in detail above, they are merely examples, and do not limit the scope of the claims. The techniques described in the claims include those in which the specific examples exemplified above are variously modified and changed.

The invention claimed is:

1. A polishing composition comprising an abrasive, a basic compound, and a surface protective agent, wherein:
   the abrasive is silica particles;
   the surface protective agent includes a cellulose derivative and a vinyl alcohol-based dispersant;
   the cellulose derivative has a weight average molecular weight of $5 \times 10^4$ or more and less than $50 \times 10^4$;
   a content of the abrasive is 0.01% by weight or more and 10% by weight or less;
   a concentration of the surface protective agent is 0.0005% by weight or more and 1.0% by weight or less;
   a concentration of the vinyl alcohol-based dispersant is 0.00001% by weight or more and 0.1% by weight or less;
   a concentration of the basic compound is 0.0005% by weight or more and less than 0.3% by weight;
   a content of the cellulose derivative per 100 g abrasive is 4 g or more and 15 g or less; and
   the surface protective agent has a dispersibility parameter α of less than 100.

2. The polishing composition according to claim 1, wherein a weight average molecular weight of the vinyl alcohol-based dispersant is 90% or less of a weight average molecular weight of the cellulose derivative.

3. The polishing composition according to claim 1, wherein a content of the vinyl alcohol-based dispersant is 0.1 g or more and 80 g or less with respect to 100 g of the cellulose derivative.

4. The polishing composition according to claim 1, wherein a total content of the cellulose derivative and the vinyl alcohol-based dispersant is 1.5 g or more and 20 g or less with respect to 100 g of the abrasive.

5. The polishing composition according to claim 1, wherein the surface protective agent further comprises an oxyalkylene-based additive.

6. The polishing composition according to claim 5, wherein the polishing composition comprises an oxyalkylene-based additive $OA_L$ having a weight average molecular weight of less than 5000 as the oxyalkylene-based additive.

7. The polishing composition according to claim 1, used for polishing of a silicon wafer.

8. The polishing composition according to claim 1, wherein a content of the vinyl alcohol-based dispersant is 50 g or less with respect to 100 g of the cellulose derivative.

9. The polishing composition according to claim 1, wherein a content of the vinyl alcohol-based dispersant is 1 g or less with respect to 100 g of the abrasive.

10. The polishing composition according to claim 1, wherein the surface protective agent further comprises an oxyalkylene-based additive in an amount of 0.3 g or more and 10 g or less with respect to 1 g of the vinyl alcohol-based dispersant.

11. The polishing composition according to claim 1, wherein:
a content of the vinyl alcohol-based dispersant is 50 g or less with respect to 100 g of the cellulose derivative; and
the surface protective agent further comprises an oxyalkylene-based additive in an amount of 0.3 g or more and 10 g or less with respect to 1 g of the vinyl alcohol-based dispersant.

12. A polishing composition comprising an abrasive, a basic compound and a surface protective agent, wherein:
the abrasive is silica particles;
the surface protective agent includes a cellulose derivative and a vinyl alcohol-based dispersant;
the cellulose derivative has a weight average molecular weight of $5 \times 10^4$ or more and less than $50 \times 10^4$;
a content of the abrasive is 0.01% by weight or more and 10% by weight or less;
a concentration of the cellulose derivative is 0.0001% by weight or more and 0.2% by weight or less;
a concentration of the vinyl alcohol-based dispersant is 0.00001% by weight or more and 0.1% by weight or less;
a concentration of the basic compound is 0.0005% by weight or more and less than 0.3% by weight;
a content of the cellulose derivative per 100 g abrasive is 4 g or more and 15 g or less; and
the surface protective agent has a dispersibility parameter $\alpha$ of less than 100.

13. The polishing composition according to claim 12, wherein a weight average molecular weight of the vinyl alcohol-based dispersant is 90% or less of a weight average molecular weight of the cellulose derivative.

14. The polishing composition according to claim 12, wherein a content of the vinyl alcohol-based dispersant is 50 g or less with respect to 100 g of the cellulose derivative.

15. The polishing composition according to claim 12, wherein a content of the vinyl alcohol-based dispersant is 1 g or less with respect to 100 g of the abrasive.

16. The polishing composition according to claim 12, wherein a total content of the cellulose derivative and the vinyl alcohol-based dispersant is 1.5 g or more and 20 g or less with respect to 100 g of the abrasive.

17. The polishing composition according to claim 12, wherein the surface protective agent further comprises an oxyalkylene-based additive in an amount of 0.3 g or more and 10 g or less with respect to 1 g of the vinyl alcohol-based dispersant.

18. The polishing composition according to claim 12, wherein the polishing composition comprises an oxyalkylene-based additive $OA_L$ having a weight average molecular weight of less than 5000 as an oxyalkylene-based additive.

19. The polishing composition according to claim 12, wherein:
a content of the vinyl alcohol-based dispersant is 50 g or less with respect to 100 g of the cellulose derivative; and
the surface protective agent further comprises an oxyalkylene-based additive in an amount of 0.3 g or more and 10 g or less with respect to 1 g of the vinyl alcohol-based dispersant.

* * * * *